: United States Patent  
Eastty et al.

(10) Patent No.: US 6,175,322 B1
(45) Date of Patent: Jan. 16, 2001

(54) SIGNAL PROCESSORS FOR ONE BIT SIGNALS

(75) Inventors: Peter Charles Eastty, Eynsham; Peter Damien Thorpe, Botley; Christopher Sleight, Chipping Norton, all of (GB)

(73) Assignee: Sony United Kingdom Limited, Weybridge (GB)

( * ) Notice: Under 35 U.S.C. 154(b), the term of this patent shall be extended for 0 days.

(21) Appl. No.: 09/177,402

(22) Filed: Oct. 23, 1998

(30) Foreign Application Priority Data

Oct. 24, 1997 (GB) .................................................. 9722532

(51) Int. Cl.$^7$ .............................. H03M 3/00; H03M 1/66; H03M 1/12
(52) U.S. Cl. ......................... 341/143; 341/143; 341/144; 341/155; 341/126
(58) Field of Search .................................... 341/143, 144, 341/155, 126

(56) References Cited

U.S. PATENT DOCUMENTS 5,055,843 * 10/1991 Ferguson, Jr. et al. ............... 341/143
5,248,972 * 9/1993 Karema et al. ....................... 341/143
5,345,233  9/1994 Nagata et al. .......................... 341/76
5,877,716 * 3/1999 Tagami ................................. 341/143

* cited by examiner

Primary Examiner—Michael Tokar
Assistant Examiner—V. Tan
(74) Attorney, Agent, or Firm—Frommer Lawrence & Haug, LLP.; William S. Frommer; Dexter T. Chang

(57) ABSTRACT

A signal processor for 1-bit signals comprises an nth order D Sigma Modulator (DSM) having an input (4) for receiving a 1-bit signal and an output (5) at which a processed 1-bit signal is produced by a quantizer (Q). The quantizer (Q) receives a p-bit signal from a series of 5 signal integration stages. Each stage comprises a first 1-bit multiplier (An) coupled to the input (4), a second 1-bit multiplier (Cn) coupled to the output (5), an adder (6n) which sums the outputs of the coefficient multipliers and an integrator (7n) which integrates the output of the adder (6n). A final stage comprises a coefficient multiplier (An+1) and an adder (6n+1). The adder (6n+1) sums the output of the coefficient multiplier (An+1) and the output of the integrator of the preceding integration stage. The input signal is fed to all the stages except the final stage via a 1-bit delay. The output signal of the quantizer is fed back to the stages via a 1-bit delay. The final stage receives the input signal without delay and also receives from the preceding stage the integral corresponding in timing to the input bit received thereby.

6 Claims, 5 Drawing Sheets

SIGNAL PROCESSORS FOR ONE BIT SIGNALS

BACKGROUND OF THE INVENTION

1. Field of the Invention

The present invention relates to a 1-bit signal processor comprising an nth order Delta-Sigma Modulator having a filter section where n is at least one. Preferred embodiments of the invention relate to processing audio signals but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an 3rd order (n=3) filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at the 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England. FIG. 2 shows a 3rd order (n=3) version of such a DSM filter section.

Referring to FIG. 2, the DSM has an input 4 for a 1-bit audio signal and an output 5 at which a processed 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1, a_2, a_3$ connected to the input 4, a second 1-bit multiplier $c_1, c_2, c_3$ connected to the output 5, an adder $6_1, 6_2, 6_3$ and an integrator $7_1, 7_2, 7_3$. Each integrator has a delay of 1 bit period.

The 1-bit multipliers multiply the received 1-bit signal by p bit coefficients $A_1, A_2, A_3, C_1, C_2, C_3$ producing p bit products which are added by the adders $6_1, 6_2, 6_3$ and the sums passed to the integrators 7. In the intermediate stages the adders $6_2, 6_3$ also sum the output of the integrator of the preceding stage. A final stage comprises another 1-bit multiplier $A_4$ connected to the input which multiplies the input signal by a p bit coefficient $A_4$ and an adder $6_4$ which adds the product to the output of the integrator $7_3$ of the preceding stage. The sum is passed to the quantizer 2.

Within the DSM, two's complement arithmetic may be used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1, a_2, a_3, a_4$ to the output 5 and fed back by multipliers $c_1, c_2, c_3$ from the output 5. Thus coefficients A1 to A4 in the feed forward path define zeros of the Z-transform transfer function of the audio signal and coefficients C1–C3 in the feed back path define poles of the transfer function of the audio signal.

The noise signal, however is fed-back from the quantizer by the multipliers $C_1$–$C_3$ so that coefficients $C_1$–$C_3$ define poles of the transfer function of the noise signal. The transfer function of the noise signal is not the same as that of the input signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:

a) finding the Z-transform H(z) of the desired filter characteristic—e.g noise shaping function; and b) transforming H(z) to coefficients.

This may be done by the methods described in the papers "Theory and Practical Implementation of a Fifth Order Sigma-Delta A/D Converter, Journal of Audio Engineering Society, Volume 39, no. 7/8, 1991 July/August by R. W Adams et al." and in the paper by Angus and Casey mentioned hereinbefore and using the knowledge of those skilled in the art. One way of calculating the coefficients is outlined in the accompanying Annex.

The DSM is clocked at the sampling rate of the 1-bit signal. For audio this rate may be in the range about 2.8 kHz to about 2.8 MHz, preferably 2.8224 MHz. TheDSM of FIG. 2 has a final adder 64 coupled to the first adder 61 via only the quantizer Q and the feedback path. All the other adders are coupled via integrator stages 71,72,73 each of which has a delay of one bit period. In an implementation in which the adders 61,62,63 take at least a major portion of a bit period in which to produce a settled sum the adders 64 and 61 slow the operation of the circuit.

SUMMARY OF THE INVENTION

According to the present invention, there is provided a signal processor for 1-bit signals, comprising an nth order Delta-Sigma Modulator (DSM) where n is at least one, the DSM having an input for receiving a 1-bit signal, a quantizer for requantizing a p-bit signal to 1-bit form the requantized signal being the output signal of the processor, a plurality of signal combiners including a first combiner for forming an integral of an additive combination of the product of the input signal and a first coefficient and of the product of the output signal and a second coefficient, at least one intermediate combiner each for forming an integral of an additive combination of the product of the input signal and a first coefficient and of the product of the output signal and a second coefficient, and of the integral of the preceding stage, and a final combiner for forming an additive combination of the product of the input signal and a first coefficient and of the integral of the preceding stage to form the said p bit signal which is requantized by the quantizer to form the 1-bit output signal, wherein the said input signal is fed to the first combiners of the first and intermediate combiners via a delay corresponding to the delay through a combiner, and to the final combiner without such delay, the 1-bit output signal of the quantizer is fed-back to the combiners via an equal delay and the final combiner receives from its preceding combiner a p-bit signal corresponding in timing to the input signal received by the final combiner.

Thus the DSM operates more quickly because the combiner of the final stage and the combiner of the first stage are separated by a 1-bit delay and compensating delays are provided elsewhere in the DSM. As a result the final and first combiners each have time to produce a settled result within a bit period without being delayed by awaiting a settled result from its previous combiner.

The invention provides a Delta Sigma Modulator in which all the adders of the combiners are, in the feedback path, from the output of the final adder to the input of the final adder, separated by 1-bit delays.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 7 is a block diagram of the integrator shown in FIG. 4; and

DESCRIPTION OF THE PREFERRED EMBODIMENTS

Figure 4:
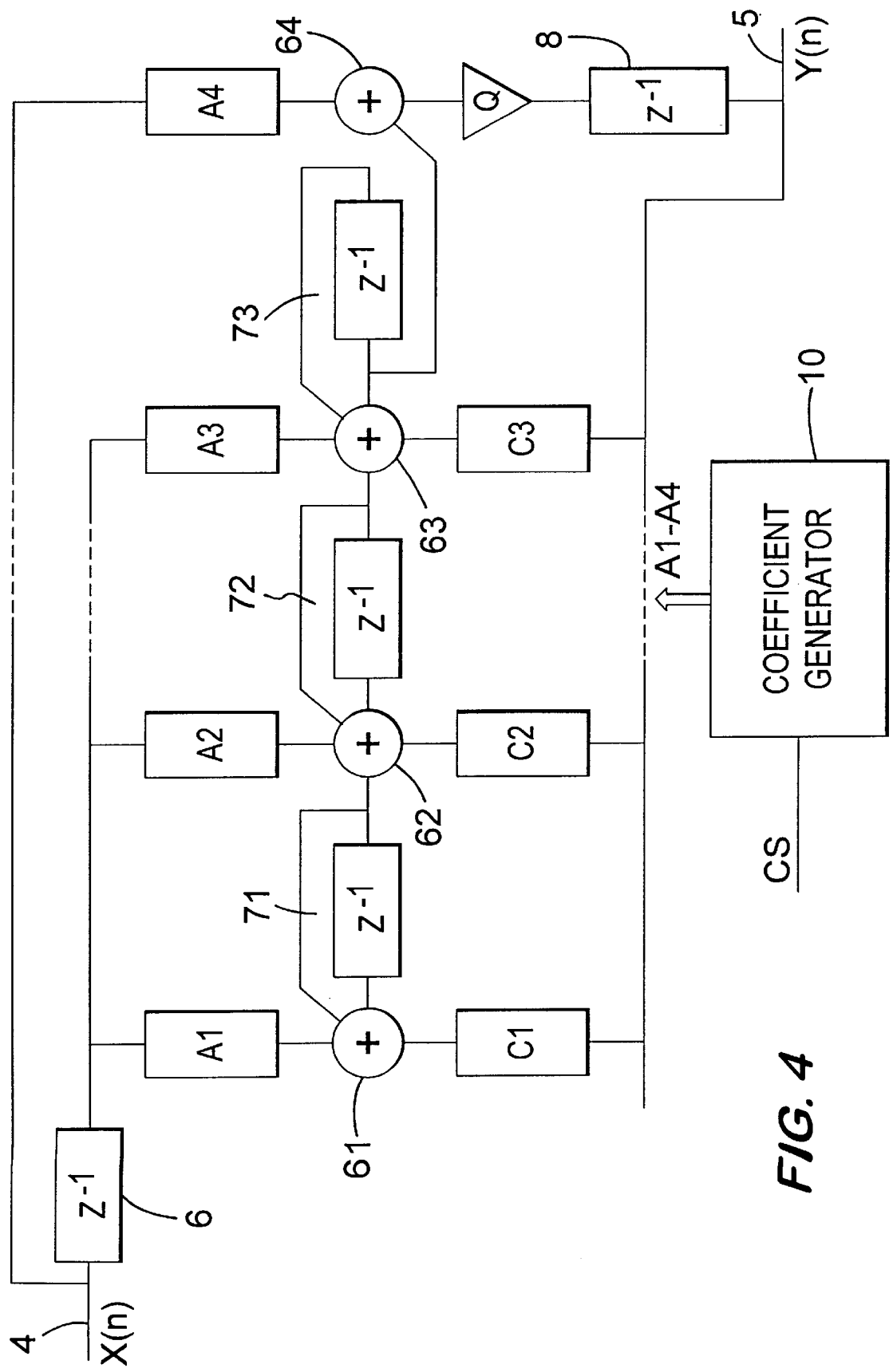
FIG. 4 is a schematic block diagram of a DSM according to the present invention.

The Delta-Sigma Modulator (DSM) of FIG. 4 is a nth order DSM having n integrator sections and a final section. The DSM has an input 4 for receiving a 1-bit signal x(n) and an output 5 at which a processed 1-bit signal Y(n) is produced. The bits are clocked through the DSM by known clocking arrangements (not shown) at the 1-bit sampling rate which may be about 2.8 MHz.

The output signal is produced by a quantizer Q in the final stage. Quantizer Q receives a p bit signal which may be, for example, in twos complement form to represent positive and negative numbers. The quantizer maybe a comparator having a threshold of zero. The quantizer quantizes positive signals as +1 (logical 1) and quantizes negative signals as −1 (logic 0). The quantizer Q is coupled to the output 5 via a 1-bit delay 8.

The first integrator section comprises a first 1-bit multiplier a connected to the input 4 via a 1-bit delay 6, a second 1-bit coefficient multiplier C1 connected to the quantizer output 5 via a 1-bit delay 8, an adder 61 which sums the outputs of the 1-bit multipliers a1 and $c_1$ and an integrator 71 which integrates the output of the adder 61. The integrator has a delay of 1 bit period. The 1-bit coefficient multipliers multiply $a_1$ and $c_1$ the 1-bit signals by p-bit coefficients A1 and C1.

Each of the intermediate integrator sections likewise comprises a first 1-bit coefficient multiplier $a_2$ to $a_3$ connected to the input 4 via the 1 bit delay 6, a second 1-bit coefficient multiplier c2, c3, connected to the quantizer Q via the 1 bit delay 8, an adder 62, 63, and an integrator 72, 73. The adders 62, 63, receive in addition to the outputs of the coefficients multipliers the output of the integrator of the preceding stage.

The final section comprises a 1-bit multiplier $a_4$ connected directly to the input 4 to receive the input signal x(n) undelayed, an adder 64, and the quantizer Q. The adder is connected, not to the output of the delay element of the integrator 73 of the preceding stage, but to the input of that delay element.

As shown in FIG. 7 each integrator in FIG. 4 comprises an adder 75 in series with a 1 bit delay element 74. The output of the delay element is fed back to the adder to accumulate the integral of the output of the adder 75 which receives the sum of the outputs of the coefficient multipliers. The adder of the integrator in FIG. 7 is implemented by the separate from the adder 61–63 which sum the outputs of the coefficient multipliers of the stages. That it is not essential: the adder of the integrator may be implemented by the adder 61, 62 or 63.

As discussed above the coefficients $A_1$ to $A_4$ and C1 to C3 may be chosen by the methods described in the above-mentioned papers.

Figure 1:
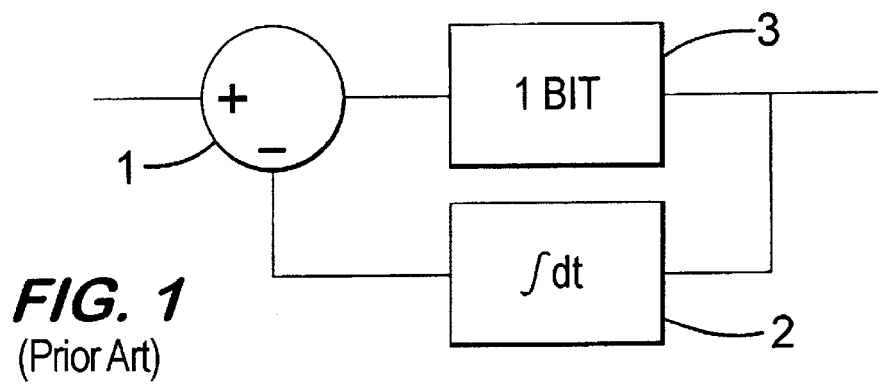
FIG. 1 is a block diagram of a known Delta-Sigma Modulator (DSM)
Figure 2:
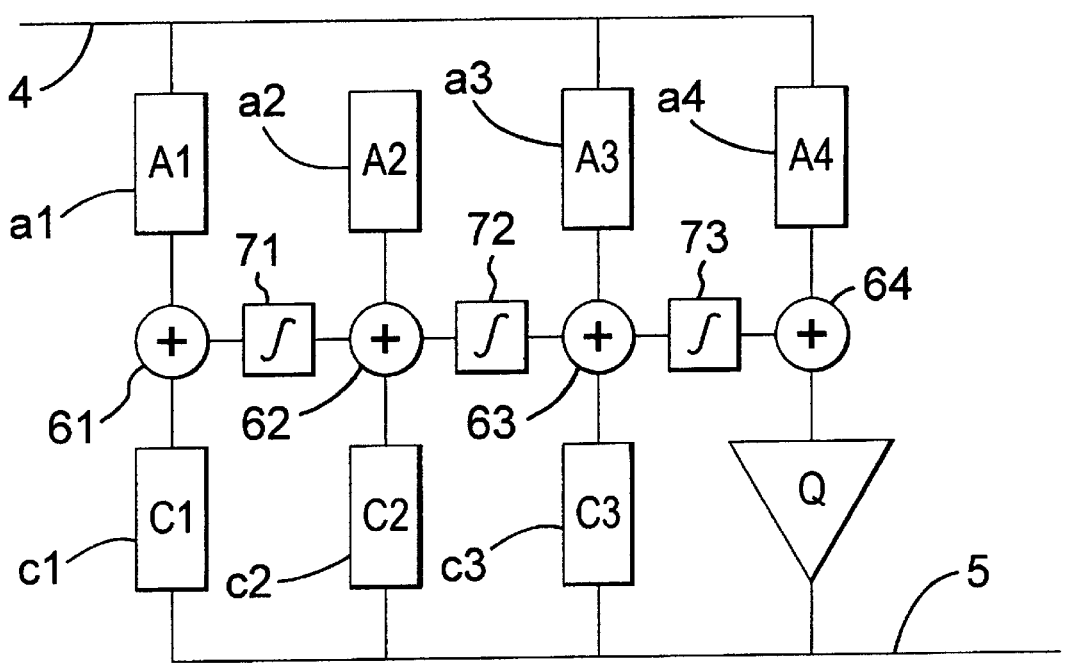
FIG. 2 is a block diagram of a previously proposed DSM.
Figure 3:
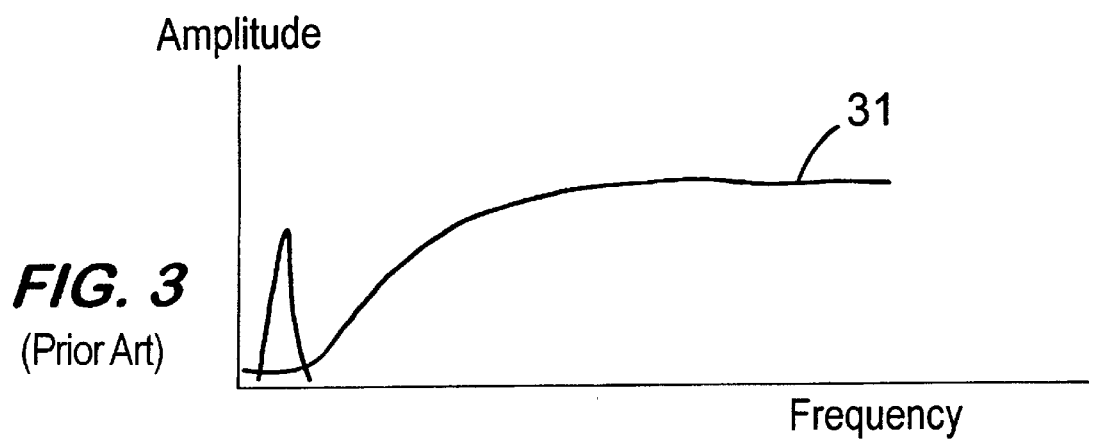
FIG. 3 shows a noise shaping characteristic.

The coefficients are, of course, chosen to provide circuit stability. Referring to FIG. 3 the coefficients are also chosen to provide noise shaping as indicated in solid line 31 in FIG. 3 whereby noise in the region of the input signal 32 (in-band noise) is reduced.

The coefficients A1 to A4 which operate on the input signal may be variable to vary the gain of the input signal.

The adders 61, 62, 63 and 64 are implemented in an example of the DSM by circuits which require at least a major portion of a 1-bit sampling period to add and produce a settled result: the adders are for example ripple-carry adders. In accordance with an embodiment of the present invention as shown in FIG. 4 the input signal x(n) is fed directly to the final stage and via the 1-bit delay 6 to the first and intermediate stages. In addition the 1-bit output signal Y(n) produced by the quantizer Q is fed back to the first and intermediate stages via a 1-bit delay 8. In addition the adder of the final stage receives the p-bit signal from its preceding stage not from the output of the delay of the preceding integrator but from the input of that delay. As a result the analysis set out in the accompanying Annex applies unchanged to the DSM of FIG. 4.

As a result the adder of the final stage receives its inputs early compared to the preceding stages because it receives its current bit of the input signal 1-bit period before the other preceding stages and also receives the corresponding bit from the integrator of the preceding stage 1 bit period early. Thus the addition it performs is settled and delivered by the compensating output delay 8 to the first stage.

Figure 5:
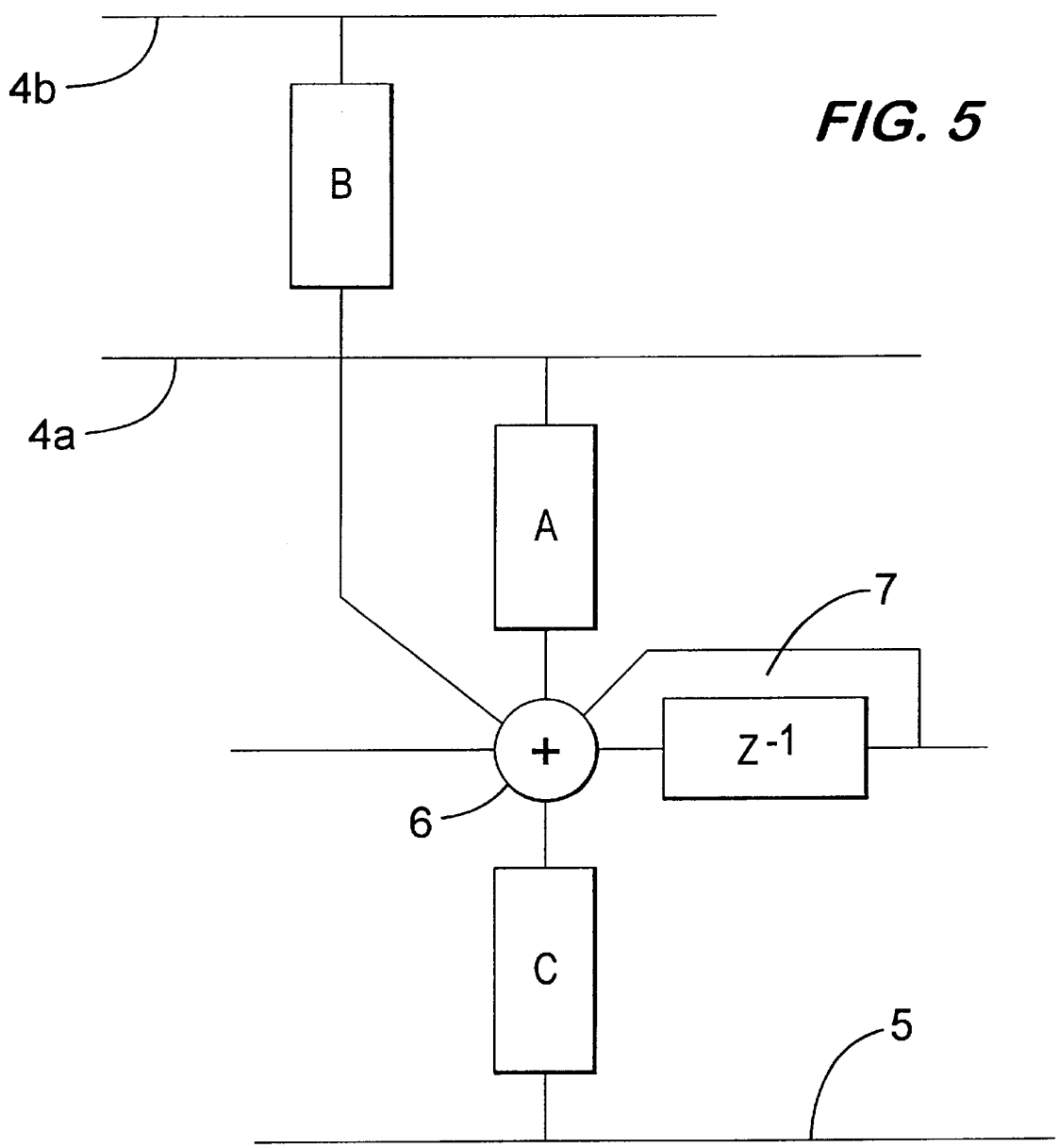
FIG. 5 is a block diagram of a modification of the DSM of FIG. 4.

Referring to FIG. 5 and as more fully described in co-filed UK application 9624671.5 Attorney reference I-96-24 (patent application S96P5063US00) a DSM may be constructed as a signal mixer. Two inputs 4a and 4b are provided the input 4a is connected to each of the adders 61 to 64 by the coefficient multipliers A1 to A6 and the input 4b is connected to the same adders by further coefficient multipliers B1 to B4. FIG. 5 shows the arrangement for just one integrator stage.

Other forms of DSM may be provided. For instance the DSM may provide a Chebyschev filter characteristic as described in co-filed application (I-97-24, S97P5077US00).

Figure 6:
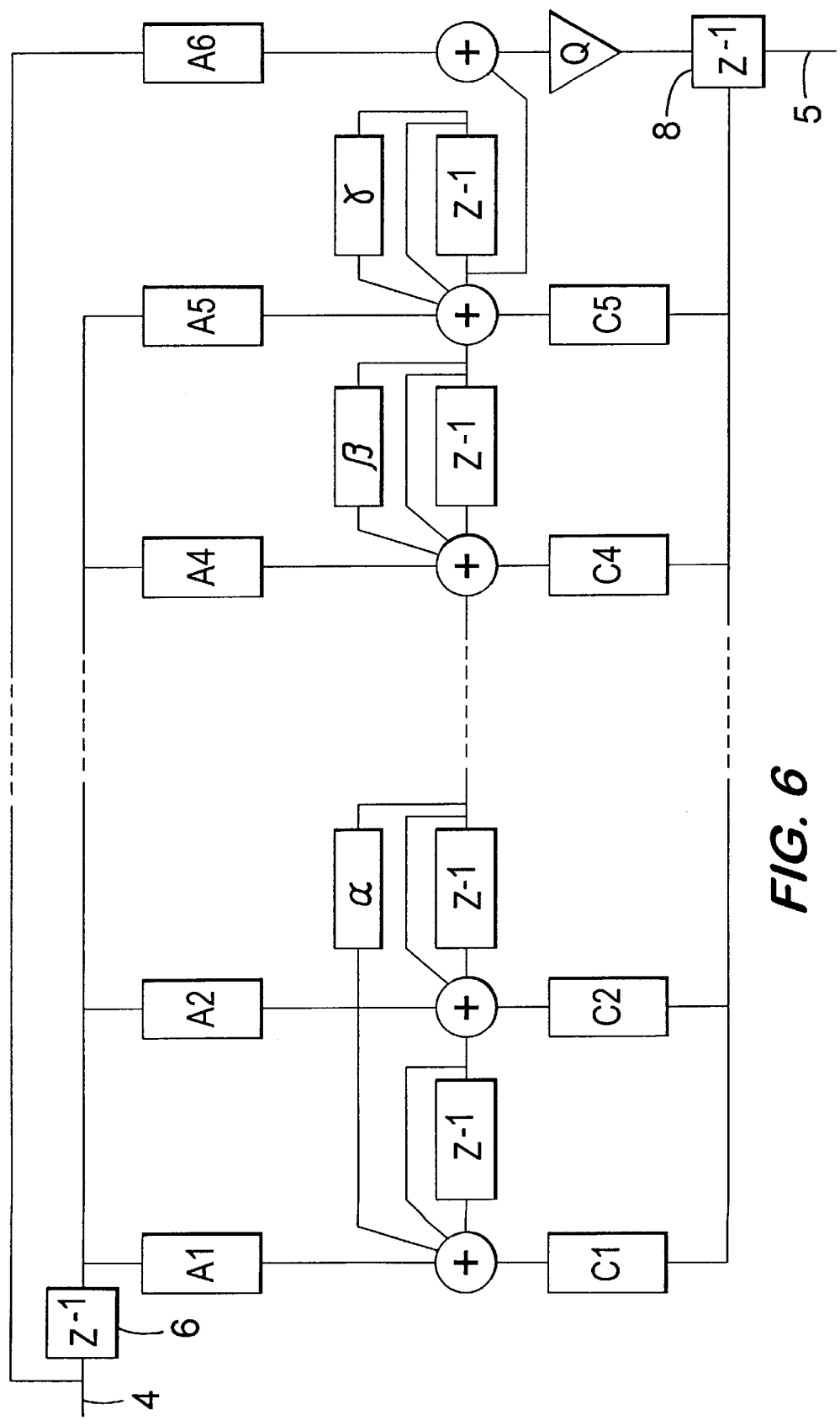
FIG. 6 is a block diagram of an alternative DSM.

An example of such a DSM is shown in FIG. 6 for order n=5. The DSM of FIG. 6 additionally comprises feedback coefficients alpha, beta, gamma etc. to provide the desired transfer characteristic. The analysis of the accompanying Annex would need to be modified to take account of the feedback coefficients.

Where the coefficients A (and B) are variable a coefficient generator 10 is provided as shown in FIG. 4. The coefficient generator 10 is responsive to a control signal C5 to calculate the coefficients A1 to A4. The generator may comprise a microcomputer.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

CALCULATING COEFFICIENTS

This annex outlines a procedure for analysing a fifth order DSM and for calculating coefficients of a desired filter characteristic.

Figure 8:
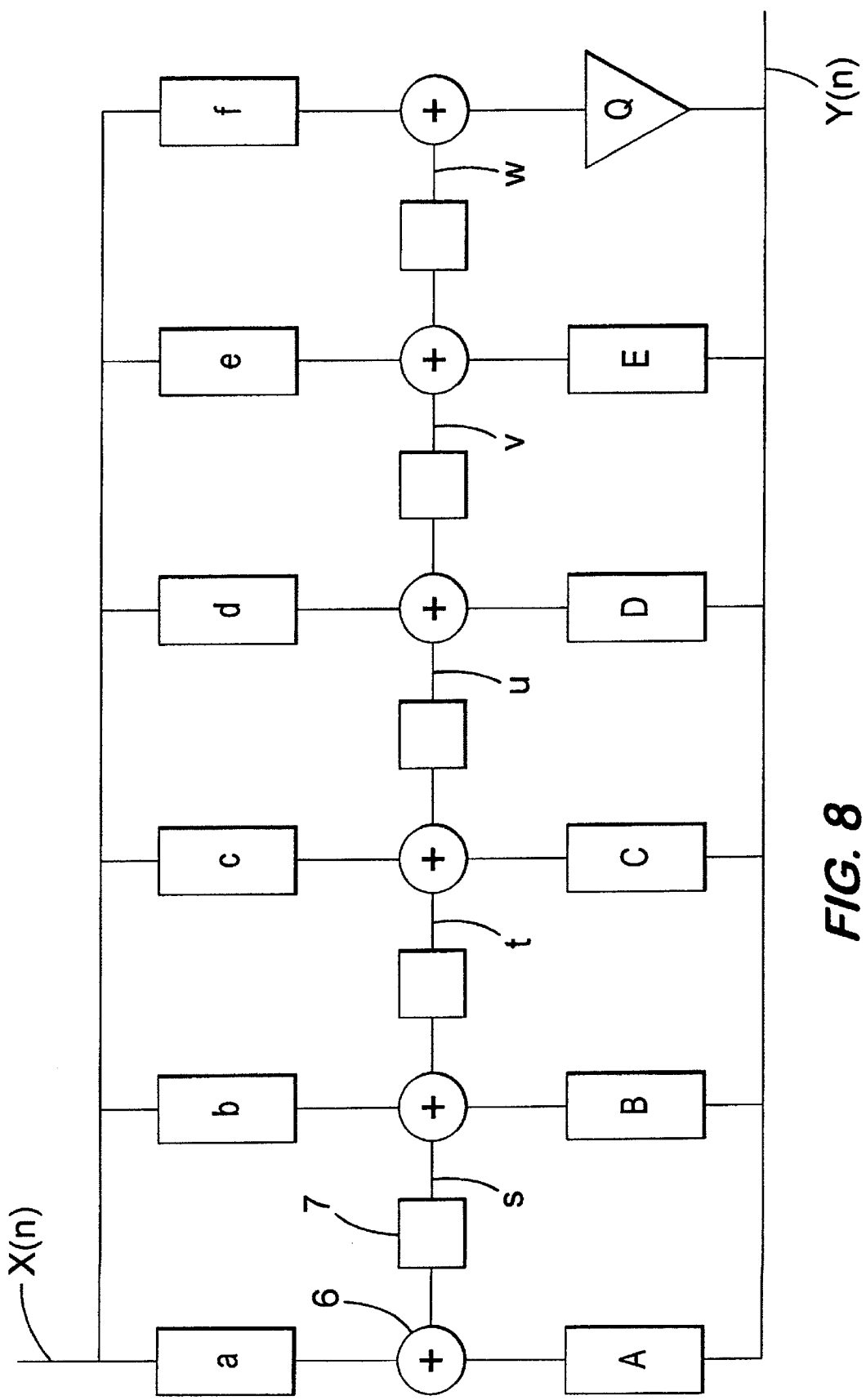
FIG. 8 is a block diagram of a fifth order DSM.

A fifth order DSM is shown in FIG. 8 having coefficients a to f and A to E, adders 6 and integrators 7. Integrators 7 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$$y[n]=fx[n]+w[n]$$

$$w[n]=w[n-1]+ex[n-1]+Ey[n-1]+v[n-1]$$

$$v[n]=v[n-1]+dx[n-1]+Dy[n-1]+u[n-1]$$

$$u[n]=u[n-1]+cx[n-1]+Cy[n-1]+t[n-1]$$

$$t[n]=t[n-1]+bx[n-1]+By[n-1]+s[n-1]$$

$$s[n]=s[n-1]+ax[n-1]+Ay[n-1]$$

These equations are transformed into z-transform equations as well known in the art resulting in equations set 2.

$$Y(z)=fX(z)+W(z)$$

$$W(z)(1-z^{-1})=z^{-1}(eX(z)+EY(z)+V(z))$$

$$V(z)(1-z^{-1})=z^{-1}(dX(z)+DY(z)+U(z))$$

$$U(z)(1-z^{-1})=z^{-1}(cX(z)+CY(z)+T(z))$$

$$T(z)(1-z^{-1})=z^{-1}(bX(z)+BY(z)+S(z))$$

$$S(z)(1-z^{-1})=z^{-1}(aX(z)+AY(z))$$

The z transform equations can be solved to derive Y(z) as a single function of X(z) (Equation 3)

$$Y(z) = fX(z) + \frac{z^{-1}}{(1-z^{-1})}\left(eX(z) + EY(z) + \frac{z^{-1}}{(1-z^{-1})}\left(dX(z) + DY(z) + \frac{z^{-1}}{(1-z^{-1})}\left(cX(z) + CY(z) + \frac{z^{-1}}{(1-z^{-1})}\left(bX(z) + BY(z) + \frac{z^{-1}}{(1-z^{-1})}(aX(z) + AY(z))\right)\right)\right)\right)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}}$$

$$= \frac{(f(1^- - z^{-1}))^5 + z^{-1}(e(1-z^{-1}))^4 + z^{-2}(d(1-z^{-1}))^3 + z^{-3}(c(1-z^{-1}))^2 + z^{-4}b(1-z^{-1}) + z^{-5}a}{(1-z^{-1})^5 - z^{-1}(E(1-z^{-1}))^4 - z^{-2}(D(1-x^{-1}))^3 - z^{-3}(C(1-z^{-1}))^2 - z^{-4}B(1-z^{-1}) - Z^{-5}A}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

The term $\alpha_0(1-z^{-1})^5$ is then subtracted from the left hand numerator resulting in $\alpha_0+\alpha_1 Z^{-1}\ldots+\ldots\alpha_5 Z^{-5}-\alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. An nth order Delta-Sigma Modulator (DSM) where n is at least one, the DSM having:
   - an input for receiving a 1-bit input signal;
   - a first delay element for delaying the received 1-bit input signal;
   - a quantizer for requantizing a p-bit signal to 1-bit form, the requantized signal being an output signal of the processor; and
   - a plurality of signal combiners, including
     - a first combiner for forming an integral of an additive combination of the product of the input signal and a first coefficient and of the product of the output signal and a second coefficient,
     - at least one intermediate combiner each for forming an integral of an additive combination of the product of the input signal and a first coefficient and of the product of the output signal and a second coefficient, and of the integral of the preceding stage, and
     - a final combiner for forming an additive combination of the product of the input signal and a first coefficient and of the integral of the preceding stage to form the p-bit signal which is requantized by the quantizer to form the 1-bit output signal,
   - wherein the input signal is fed to the first combiner and intermediate combiners via the first delay element corresponding to the delay through a combiner, and to the final combiner without such delay,
   - wherein the 1-bit output signal of the quantizer is fed-back to the combiners via a second delay element having a delay substantially equal to that of the first delay element, and
   - wherein the final combiner receives from its preceding combiner a p-bit signal corresponding in timing to the input signal received by the final combiner.

2. A processor according to claim 1, wherein the first coefficients are variable.

3. A processor according to claim 2, further comprising means for producing the variable first coefficients.

4. A processor according to claim 1, wherein each combiner comprises a ripple-carry adder.

5. A processor according to claim 1, wherein the DSM has a further input for receiving a further 1-bit signal and each combiner additionally combines the product of the further 1-bit signal with a further coefficient with the aforesaid additive combination.

6. An audio signal processor comprising a signal processor according to claim 1.

* * * * *